(12) United States Patent
Huang et al.

(10) Patent No.: US 9,091,427 B2
(45) Date of Patent: Jul. 28, 2015

(54) DISPLAY APPARATUS AND MANUFACTURING METHOD THEREOF

(71) Applicant: InnoLux Corporation, Miao-Li County (TW)

(72) Inventors: Shih-Chang Huang, Miao-Li County (TW); Jeng-Wei Yeh, Miao-Li County (TW); Kuei-Ling Liu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 13/964,515

(22) Filed: Aug. 12, 2013

(65) Prior Publication Data

US 2014/0071659 A1    Mar. 13, 2014

(30) Foreign Application Priority Data

Sep. 7, 2012   (TW) .............................. 101132754 A (51) Int. Cl.
*F21V 33/00* (2006.01)
*G02F 1/1335* (2006.01)
*H01L 27/32* (2006.01)
*B82Y 20/00* (2011.01)

(52) U.S. Cl.
CPC ...... *F21V 33/0052* (2013.01); *G02F 1/133514* (2013.01); *H01L 27/322* (2013.01); *H01L 27/3211* (2013.01); *B82Y 20/00* (2013.01); *G02F 1/133603* (2013.01); *G02F 2001/133614* (2013.01); *H01L 2251/55* (2013.01); *Y10S 977/952* (2013.01)

(58) Field of Classification Search
CPC ........ H01L 2251/55; H01L 27/3211–27/3218; H01L 27/322; F21V 33/0052; F02F 1/133514
USPC .................................................. 313/498–512
See application file for complete search history.

(56) References Cited

U.S. PATENT DOCUMENTS

| | | | |
|---|---|---|---|
| 2004/0169452 A1* | 9/2004 | Yu et al. ........................ | 313/110 |
| 2006/0227260 A1 | 10/2006 | Haga et al. | |
| 2007/0076014 A1* | 4/2007 | De Vaan ........................ | 345/597 |
| 2008/0112069 A1 | 5/2008 | Helber et al. | |
| 2009/0135338 A1 | 5/2009 | Wang et al. | |

FOREIGN PATENT DOCUMENTS

EP        1 909 134 A2    4/2008

* cited by examiner

*Primary Examiner* — Anne Hines
(74) *Attorney, Agent, or Firm* — Muncy, Geissler, Olds & Lowe, P.C.

(57) ABSTRACT

A display apparatus comprises a display panel. The display panel emits a green light having a green energy and a green point of the CIE 1931 xy chromaticity under the operation of the highest gray level of a green image, and emits a blue light having a blue energy and a blue point of the CIE 1931 xy chromaticity under the operation of the highest gray level of a blue image. The ratio of the green energy to the blue energy is between 0.7 and 1.2. In the CIE 1931 chromaticity diagram, the coordinates of the blue point are bounded by the equation: $y=-168.72x^2+50.312x-3.635$ and the equation: $y=-168.72x^2+63.81x-5.9174$, while y is between 0.04 and 0.08.

18 Claims, 4 Drawing Sheets

FIG.5 forming a display panel, wherein the display panel emits a green light having a green energy and a green point of the CIE 1931 xy chromaticity under the operation of the highest gray level of a green image, and emits a blue light having a blue energy and a blue point of the CIE 1931 xy chromaticity under the operation of the highest gray level of a blue image — S01 adjusting the ratio of the green energy to the blue energy as between 0.7 and 1.2, wherein the coordinates of the blue point in the CIE 1931 xy chromaticity diagram are bounded by the equation: $y=-168.72x^2+50.312x-3.635$ and the equation: $y=-168.72x^2+63.81x-5.9174$, while the y is between 0.04 and 0.08 — S02

FIG.6

DISPLAY APPARATUS AND MANUFACTURING METHOD THEREOF

CROSS REFERENCE TO RELATED APPLICATIONS

This Non-provisional application claims priority under 35 U.S.C. §119(a) on Patent Application No(s). 101132754 filed in Taiwan, Republic of China on Sep. 7, 2012, the entire contents of which are hereby incorporated by reference.

BACKGROUND

1. Technical Field

The disclosed embodiments relate to a display apparatus and, in particular, to a display apparatus and a manufacturing method thereof.

2. Related Art

Because the current display apparatuses (e.g. LCD apparatuses) have advantages such as low power consumption, light weight and less radiation, they are gradually taking the place of cathode ray tube (CRT) display apparatuses and widely applied to various electronic products.

For the design of a display apparatus, color taste is an important design factor and it can be shown by the chromaticity diagram. For example, the light emitted from a display panel can be specifically represented by a CIE 1931 xy chromaticity diagram, in which three primary colors (blue, green and red) have their respective color points, i.e. three vertices of the color triangle in the diagram. Presently, sRGB is commonly used as a chromaticity standard. Based on sRGB color space, in the CIE 1931 xy chromaticity diagram, the blue point is specified as (0.15, 0.06), the green point is specified as (0.3, 0.6), and the red point is specified as (0.64, 0.33), in coordinates (x,y). If the color points of three primary colors of a light deviate from the color points defined by the sRGB standard too much, the colors displayed by the display panel may be distorted, so that the displayed images loss quality.

Therefore, it is an important subject to provide a display apparatus so that the color points of primary colors of the light emitted by the display apparatus can be maintained within a better range in the chromaticity diagram for enhancing the display quality and product competitiveness.

SUMMARY

In view of the foregoing subject, an objective of this disclosure is to provide a display apparatus and a manufacturing method thereof so that the color points of primary colors of the light emitted by the display apparatus can be maintained within a better range in the chromaticity diagram for enhancing the display quality and product competitiveness.

To achieve the above objective, a display apparatus according to the embodiments of this disclosure comprises a display panel. The display panel emits a green light having a green energy and a green point of the CIE 1931 xy chromaticity under the operation of the highest gray level of a green image, and emits a blue light having a blue energy and a blue point of the CIE 1931 xy chromaticity under the operation of the highest gray level of a blue image. The ratio of the green energy to the blue energy is between 0.7 and 1.2, and the coordinates of the blue point in the CIE 1931 xy chromaticity diagram are bounded by the equation: $y=-168.72x^2+50.312x-3.635$ and the equation: $y=-168.72x^2+63.81x-5.9174$, while the y is between 0.04 and 0.08.

In one embodiment, the coordinates of the green point in the chromaticity diagram are bounded by the equation: $y=-48.85x^2+22.964x-2.0014$ and the equation: $y=-48.85x^2+26.872x-2.9981$, while the y is between 0.58 and 0.64.

In one embodiment, the coordinates of the green point in the chromaticity diagram are bounded by the equation: $y=-48.85x^2+22.964x-2.0014$ and the equation: $y=-48.85x^2+26.872x-2.9981$, while the y is between 0.64 and 0.7.

In one embodiment, the ratio of the green energy to the blue energy is further between 0.8 and 1.1.

In one embodiment, the display panel emits a red light having a red energy and a red point of the CIE 1931 xy chromaticity under the operation of the highest gray level of a red image, and the ratio of the red energy to the blue energy is between 0.49 and 0.75.

In one embodiment, the ratio of the red energy to the blue energy is further between 0.5 and 0.7.

In one embodiment, the coordinates of the red point in the chromaticity diagram are bounded by the equation: $y=-2.021x^2+2.1871x-0.2218$ and the equation: $y=-2.021x^2+2.1871x-0.2618$, while the x is between 0.62 and 0.66.

In one embodiment, the coordinates of the red point in the chromaticity diagram are bounded by the equation: $y=-2.021x^2+2.1871x-0.2218$ and the equation: $y=-2.021x^2+2.1871x-0.2618$, while the x is between 0.66 and 0.68.

In one embodiment, the display panel is a liquid crystal display panel, a quantum dot display panel or an organic light-emitting diode display panel.

In one embodiment, the OLED display panel includes a substrate and a light-emitting layer, which is disposed on the substrate and includes a plurality of red light-emitting portions, a plurality of green light-emitting portions and a plurality of blue light-emitting portions.

In one embodiment, the OLED display panel includes a substrate, a light-emitting layer and a filter layer, the light-emitting layer is disposed on the substrate and emits white light, and the filter layer is disposed on the light-emitting layer and includes a plurality of red filter portions, a plurality of green filter portions and a plurality of blue filter portions.

In one embodiment, the green energy is corresponding to an integral area of a green spectrum of the light, and the blue energy is corresponding to an integral area of a blue spectrum of the light.

In one embodiment, the red energy is corresponding to an integral area of a red spectrum of the light.

To achieve the above objective, a manufacturing method of a display apparatus according to the embodiments of this disclosure comprises steps of: forming a display panel, wherein the display panel emits a green light having a green energy and a green point of the CIE 1931 xy chromaticity under the operation of the highest gray level of a green image, and emits a blue light having a blue energy and a blue point of the CIE 1931 xy chromaticity under the operation of the highest gray level of a blue image; and adjusting the ratio of the green energy to the blue energy as between 0.7 and 1.2, wherein the coordinates of the blue point in the CIE 1931 xy chromaticity diagram are bounded by the equation: $y=-168.72x^2+50.312x-3.635$ and the equation: $y=-168.72x^2+63.81x-5.9174$, while the y is between 0.04 and 0.08.

As mentioned above, in the display apparatus and the manufacturing method thereof, under the operations of the highest gray level of a green and a blue image respectively, the ratio of the green energy to the blue energy of the light is limited as between 0.7 and 1.2, and the coordinates of the blue point in the CIE 1931 xy chromaticity diagram are bounded by the equation: $y=-168.72x^2+50.312x-3.635$ and the equation: $y=-168.72x^2+63.81x-5.9174$, while the y is between 0.04 and 0.08. Since such color point is located within a better range, the display quality of the display apparatus of this disclosure is enhanced a lot.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION

The present invention will be apparent from the following detailed description, which proceeds with reference to the accompanying drawings, wherein the same references relate to the same elements.

The display apparatus in this disclosure is not limited in type, and it can be a liquid crystal display (LCD) apparatus, a quantum dot display apparatus, or an organic light-emitting diode (OLED) display apparatus for example.

Figure 1:
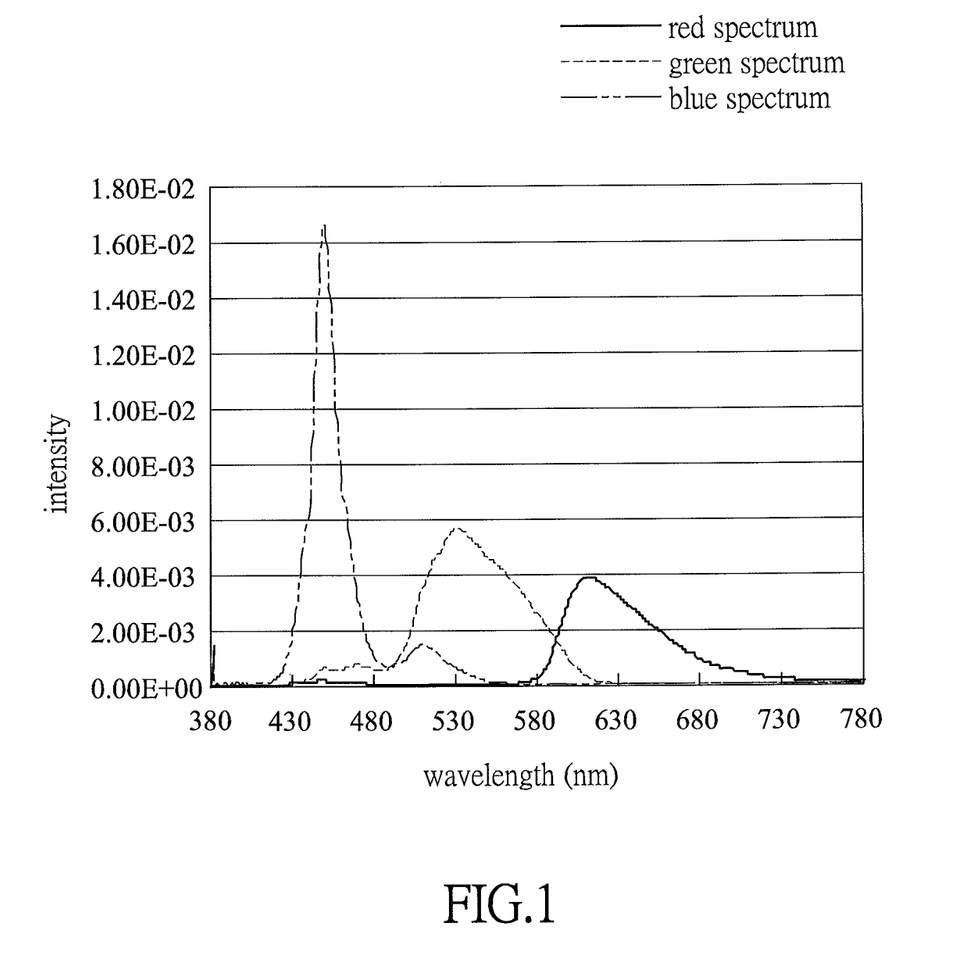
FIG. 1 is a schematic diagram of an intensity spectrum of the light emitted from a display panel according to an embodiment of this disclosure.

In an embodiment of this disclosure, the display apparatus includes a display panel, which can be a liquid crystal display (LCD) panel, a quantum dot display panel, or an organic light-emitting diode (OLED) display panel for example. The display panel emits a green light having a green energy and a green point of the CIE 1931 xy chromaticity under the operation of the highest gray level (such as 255th gray level for an 8-bit color level) of a green image, and emits a blue light having a blue energy and a blue point of the CIE 1931 xy chromaticity under the operation of the highest gray level (such as 255th gray level for an 8-bit color level) of a blue image. The ratio of the green energy to the blue energy is between 0.7 and 1.2. FIG. 1 is a schematic diagram of an intensity spectrum (the unit of the intensity of the y coordinate is arbitrary) of the light emitted from the display panel. The intensity spectrum includes a green spectrum, a blue spectrum and a red spectrum. Herein, the green spectrum is obtained when the display panel only displays the image of the highest gray level of green (e.g. 255th gray level), the red spectrum is obtained when the display panel only displays the image of the highest gray level of red (e.g. 255th gray level), and the blue spectrum is obtained when the display panel only displays the image of the highest gray level of blue (e.g. 255th gray level). Here, the green energy is corresponding to an integral area of the green spectrum (i.e. the area under the curve representing the green spectrum), and the blue energy is corresponding to an integral area of the blue spectrum (i.e. the area under the curve representing the blue spectrum). Moreover, when the design requirement is much closer to the sRGB standard, the better case is that the ratio of the green energy of the light to the blue energy of the light is between 0.8 and 1.1, and therefore the blue point and the green point in the CIE 1931 xy chromaticity diagram will be closer to the defined color points of the sRGB standard.

Figure 2:
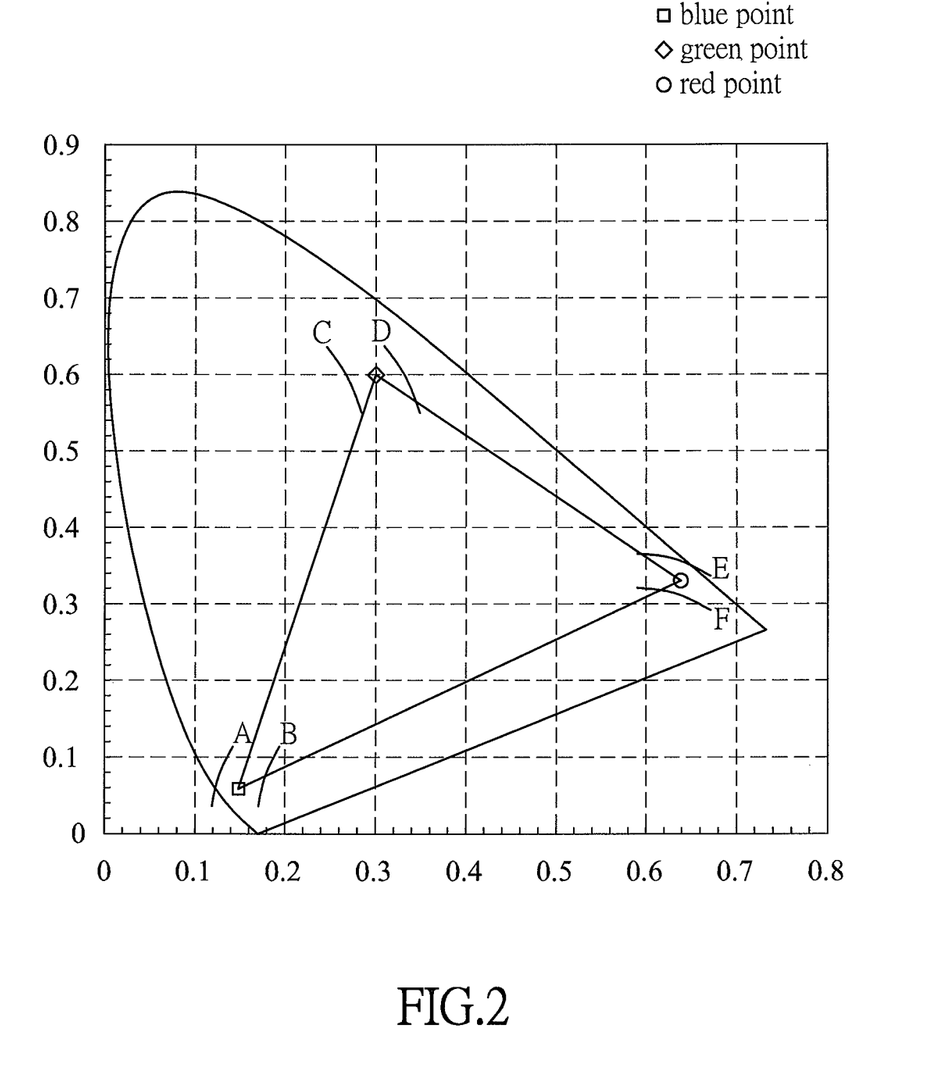
FIG. 2 is a CIE 1931 xy chromaticity diagram corresponding to the light emitted from a display panel according to an embodiment of this disclosure.

FIG. 2 is a CIE 1931 xy chromaticity diagram corresponding to the light emitted from the display panel according to this embodiment. When the energy of the light emitted from the display panel under the operation of the highest gray level (such as 255th gray level) is in conformity with the above-mentioned condition, the coordinates (x, y) of the blue point in the chromaticity diagram are bounded by the equation: $y=-168.72x^2+50.312x-3.635$ (equation A in FIG. 2) and the equation: $y=-168.72x^2+63.81x-5.9174$ (equation B in FIG. 2), while the y is between 0.04 and 0.08. Thereby, the display quality and color taste of the display panel can be enhanced.

Furthermore, when the energy of the light emitted from the display panel under the operation of the highest gray level (such as 255th gray level) is in conformity with the above-mentioned condition, the coordinates (x, y) of the green point in the chromaticity diagram are bounded by the equation: $y=-48.85x^2+22.964x-2.0014$ (equation C in FIG. 2) and the equation: $y=-48.85x^2+26.872x-2.9981$ (equation D in FIG. 2), while the y is between 0.58 and 0.64. Besides, in consideration of a case of high color gamut with NTSC greater than or equal to 80% wherein the color saturation is higher and each single color is more vivid, the y coordinate of the green point can be specified as between 0.64 and 0.7.

By referring to FIG. 1 again, when the display panel emits a red light having a red energy and a red point of the CIE 1931 xy chromaticity under the operation of the highest gray level (such as 255th gray level) of a red image, the ratio of the red energy to the blue energy can be designed as between 0.49 and 0.75. The red energy is corresponding to an integral area of the red spectrum in FIG. 1 (i.e. the area under the curve representing the red spectrum). Besides, when the design requirement is much closer to the sRGB standard, a better case is that the ratio of the red energy of the light to the blue energy of the light is between 0.5 and 0.7, and therefore the blue point and the red point in the CIE 1931 xy chromaticity diagram will be closer to the defined color points of the sRGB standard.

Accordingly, as shown in FIG. 2, when the energy of the light emitted from the display panel under the operation of the highest gray level (such as 255th gray level) is in conformity with the above-mentioned condition, the coordinates (x, y) of the red point in the chromaticity diagram are bounded by the equation: $y=-2.021x^2+2.1871x-0.2218$ (equation E in FIG. 2) and the equation: $y=-2.021x^2+2.1871x-0.2618$ (equation F in FIG. 2), while the x is between 0.62 and 0.66. Thereby, the display quality and color taste of the display panel can be enhanced. Besides, in consideration of a case of high color gamut with NTSC greater than or equal to 80%, the x coordinate of the red point can be specified as between 0.66 and 0.68. To be noted, the condition of the ratio of the green energy to the blue energy and the condition of the ratio of the red energy to the blue energy can be effective separately or together.

In the embodiments of this disclosure, the display panel can have variations, and some of them are illustrated as below for example.

Figure 3:
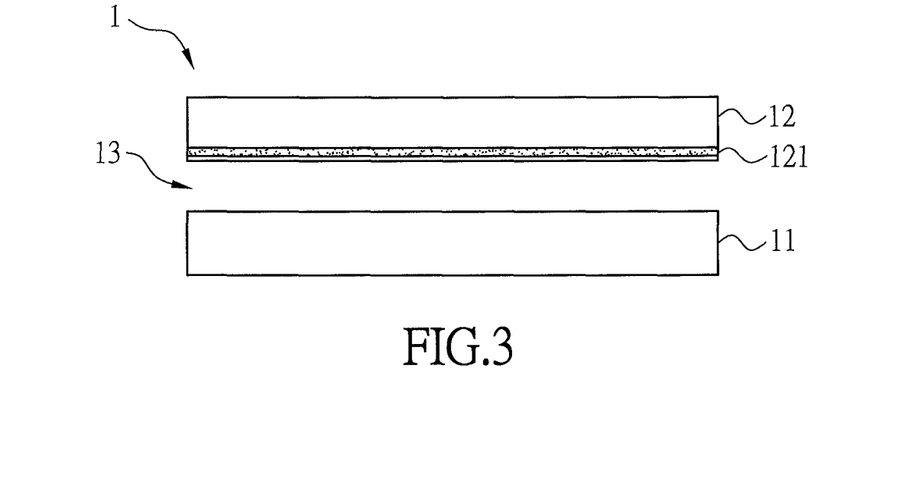
FIG. 3 is a schematic diagram of a display panel being a liquid crystal display (LCD) panel according to an embodiment of this disclosure.

FIG. 3 is a schematic diagram of a display panel 1 being a liquid crystal display (LCD) panel according to an embodiment of this disclosure. The display panel 1 includes a first substrate 11, a second substrate 12, and a liquid crystal layer 13. The first substrate 11 is a thin film transistor (TFT) substrate, and the second substrate 12 is a color filter substrate, for example. The liquid crystal layer 13 is disposed between the first substrate 11 and the second substrate 12. Each of the first and second substrates 11 and 12 can be a glass substrate, a transparent acrylic substrate or a flexible substrate, and also can be a touch substrate. As an embodiment, the second substrate 12 includes a color filter layer 121, which includes a blue filter portion, a green filter portion and a red filter portion. When the light emitted by the backlight module of the LCD apparatus passes through the blue filter portion, the blue energy of the light out of the display panel 1 is formed and can be shown by the blue spectrum of the light. When the light emitted by the backlight module of the LCD apparatus passes through the green filter portion, the green energy of the light of the display panel 1 is achieved and can be represented by the green spectrum of the light. When the light emitted by the backlight module of the LCD apparatus passes through the red filter portion, the red energy of the light of the display panel 1 is achieved and can be represented by the red spectrum of the light.

The blue energy, green energy and red energy of the display panel can be calculated as follows:

For the blue energy, $B = \int_{380}^{780} BLU(\lambda) * BCF(\lambda) * CELL(\lambda) d\lambda$ For the green energy, $G = \int_{380}^{780} BLU(\lambda) * GCF(\lambda) * CELL(\lambda) d\lambda$ For the red energy, $R = \int_{380}^{780} BLU(\lambda) * BCF(\lambda) * CELL(\lambda) d\lambda$ $BLU(\lambda)$ denotes the energy distribution spectrum of the backlight module. $BCF(\lambda)$ denotes the transmission spectrum of the blue filter portion, $GCF(\lambda)$ denotes the transmission spectrum of the green filter portion, and $RCF(\lambda)$ denotes the transmission spectrum of the red filter portion. $CELL(\lambda)$ denotes the liquid crystal transmission spectrum of the display panel excluding the color filter (CF) layer, and $\lambda$ denotes wavelength. The numbers of 380 and 780 denote the wavelength range of the integral calculation with the unit of "nm", and the unit of the integral of the blue energy, green energy and red energy is light watt. It can be seen from the calculations that the energy of each color can be adjusted by changing $BLU(\lambda)$, $CF(\lambda)$ (including $BCF(\lambda)$, $GCF(\lambda)$, $RCF(\lambda)$) or $CELL(\lambda)$.

Since the energy can be adjusted by designing the transmission spectrum $CF(\lambda)$ of the filter portions, the energy can be adjusted by changing the material type of filter portions (e.g. R254, R177, G7, G36, G58, Y150, Y138, Y139, B15:6, etc.) and their weight percentages. For example, the peak wavelength of the transmission spectrum of the blue filter portion is specified as between 440 nm and 470 nm, the peak wavelength of the transmission spectrum of the green filter portion is specified as between 500 nm and 550 nm, and under the operations of the highest gray level of a green and a blue image respectively, the ratio of the green energy to the blue energy is specified as between 0.7 and 1.2. Therefore, the coordinates (x, y) of the blue point in the CIE 1931 xy chromaticity diagram are bounded by the equation: $y=-168.72x^2+50.312x-3.635$ (equation A in FIG. 2) and the equation: $y=-168.72x^2+63.81x-5.9174$ (equation B in FIG. 2), while the y is between 0.04 and 0.08. Besides, the coordinates (x, y) of the green point in the chromaticity diagram are bounded by the equation: $y=-48.85x^2+22.964x-2.0014$ (equation C in FIG. 2) and the equation: $y=-48.85x^2+26.872x-2.9981$ (equation D in FIG. 2), while the y is between 0.58 and 0.64.

When the design requirement is much closer to the sRGB standard, the better case is that the ratio of the green energy of the light to the blue energy of the light is between 0.8 and 1.1. Besides, in consideration of a case of high color gamut with NTSC greater than or equal to 80% wherein the color saturation is higher and each single color is more vivid, the y coordinate of the green point can be specified as between 0.64 and 0.7 while the ratio of the green energy to the blue energy is in conformity with the above-mentioned condition.

Besides, the ratio of the red energy to the blue energy can be adjusted as between 0.49 and 0.75, so that the coordinates (x, y) of the red point in the chromaticity diagram are bounded by the equation: $y=-2.021x^2+2.1871x-0.2218$ (equation E in FIG. 2) and the equation: $y=-2.021x^2+2.1871x-0.2618$ (equation F in FIG. 2), while the x is between 0.62 and 0.66. Besides, when the design requirement is much closer to the sRGB standard, a better case is that the ratio of the red energy to the blue energy is between 0.5 and 0.7. If the application of high color gamut is considered, the x coordinate of the red point can be specified as between 0.66 and 0.68.

Otherwise, the energy ratio can be adjusted by designing $BLU(\lambda)$ of the backlight module. For example, when blue LEDs cooperate with red and green phosphor powders to bring about a spectrum in the backlight module, the material type or weight percentage of the phosphor powders or the current of the backlight module can be changed, so that the peak wavelength of the blue light is approximately between 440 nm and 470 nm, the peak wavelength of the transmission spectrum of the green phosphor powder is between 500 nm and 550 nm, and the peak wavelength of the transmission spectrum of the red phosphor powder is between 600 nm and 660 nm. As another example, when blue LEDs cooperate with yellow phosphor powder in the backlight module, the material type or weight percentage of the phosphor powder or the current of the backlight module can be changed, so that the peak wavelength of the blue light is approximately between 440 nm and 470 nm, the peak wavelength of the transmission spectrum of the yellow phosphor powder is between 550 nm and 570 nm. According to the above-mentioned cases, the ratio of the red energy to the blue energy, under the operations of the highest gray level of a red and a blue image respectively, can be adjusted, so that the coordinates of the color points in the chromaticity diagram are in conformity with the above-mentioned design conditions. The adjustment of the ratio of the green energy to the blue energy can be conducted similarly, and therefore it is not described here for concise purpose.

Otherwise, $CELL(\lambda)$ of the liquid crystal transmission spectrum can be adjusted to change and make the energy ratio in conformity with the above-mentioned design conditions, and the related description is omitted here for concise purpose.

The display panel 1 can have variations by different technologies. For example, the color filter layer is disposed to the TFT array (i.e. color filter on array, COA), or the TFT array is disposed to the color filter substrate (i.e. TFT on CF, TOC or array on CF). The first substrate 11 and the second substrate 12 each can be a transparent acrylic substrate or a flexible substrate. Accordingly, the related green energy and blue energy, or the related red energy and blue energy can be designed in conformity with the above-mentioned conditions so that the coordinates of the color points in the chromaticity diagram can be located within the required range.

Figure 5:
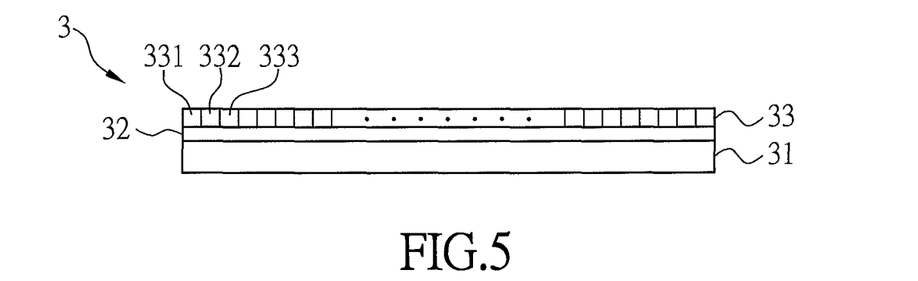
FIG. 5 is a schematic diagram of a display panel being an OLED display panel according to an embodiment of this disclosure.

FIG. 5 is a schematic diagram of a display panel 3 being an OLED display panel according to an embodiment of this disclosure. The display panel 3 includes a substrate 31, a light-emitting layer 32 and a filter layer 33. The light-emitting layer 32 emits white light. The filter layer 33 includes a plurality of red filter portions 331, a plurality of green filter portions 332 and a plurality of blue filter portions 333. The substrate 31 and the opposite substrate (not shown) each can be a glass substrate, a transparent acrylic substrate or a flexible substrate, and also can be a touch substrate. The substrate 31 and the opposite substrate can be covered by a protection film. In this embodiment, when the white light emitted by the light-emitting layer 32 passes through the red filter portions 331, the red energy of the light out of the display panel 3 is formed and can be shown by the red spectrum of the light. When the white light emitted by the light-emitting layer 32 passes through the green filter portions 332, the green energy of the light out of the display panel 3 is formed and can be shown by the green spectrum of the light. When the white light emitted by the light-emitting layer 32 passes through the blue filter portions 333, the blue energy of the light out of the display panel 3 is formed and can be shown by the blue spectrum of the light. Herein, the red spectrum is obtained when the display panel only displays the image of the highest gray level of red (e.g. 255th gray level), the green spectrum is obtained when the display panel only displays the image of the highest gray level of green (e.g. 255th gray level), and the blue spectrum is obtained when the display panel only displays the image of the highest gray level of blue (e.g. 255th gray level).

In this embodiment, the color energy can be adjusted by designing the filter layer or the light-emitting layer, so that the ratio of the green energy to the blue energy or the ratio of the red energy to the blue energy is adjusted in conformity with the above-mentioned design conditions. For example, the material type of filter layer (e.g. R254, R177, G7, G36, G58, Y150, Y138, Y139, B15:6, etc.) and the weight percentage thereof can be designed. For example, the peak wavelength of the transmission spectrum of the blue filter portion is specified as between 440 nm and 470 nm, the peak wavelength of the transmission spectrum of the green filter portion is specified as between 500 nm and 550 nm, and under the operations of the highest gray level of a green and a blue image respectively, the ratio of the green energy to the blue energy is specified as between 0.7 and 1.2. Therefore, the coordinates (x, y) of the blue point in the CIE 1931 xy chromaticity diagram are bounded by the equation: $y=-168.72x^2+50.312x-3.635$ (equation A in FIG. 2) and the equation: $y=-168.72x^2+63.81x-5.9174$ (equation B in FIG. 2), while the y is between 0.04 and 0.08. Besides, the coordinates (x, y) of the green point in the chromaticity diagram are bounded by the equation: $y=-48.85x^2+22.964x-2.0014$ (equation C in FIG. 2) and the equation: $y=-48.85x^2+26.872x-2.9981$ (equation D in FIG. 2), while the y is between 0.58 and 0.64. Preferably, the ratio of the green energy to the blue energy is between 0.8 and 1.1. Besides, in consideration of a case of high color gamut with NTSC greater than or equal to 80% wherein the color saturation is higher and each single color is more vivid, the y coordinate of the green point can be specified as between 0.64 and 0.7 while the ratio of the green energy to the blue energy is in conformity with the above-mentioned condition.

Otherwise, the material or weight percentage of the light-emitting layer can be designed, or the current inputted to the light-emitting layer can be designed, so that the peak wavelength of the blue portion of the intensity spectrum of the light-emitting layer is between 440 nm and 470 nm, the peak wavelength of the green portion is between 500 nm and 550 nm, the wavelength of the red portion is between 600 nm and 660 nm, and the ratio of the red energy to the blue energy is between 0.49 and 0.75. Therefore, the coordinates (x, y) of the red point in the chromaticity diagram are bounded by the equation: $y=-2.021x^2+2.1871x-0.2218$ (equation E in FIG. 2) and the equation: $y=-2.021x^2+2.1871x-0.2618$ (equation F in FIG. 2), while the x is between 0.62 and 0.66. Besides, the coordinates of the blue point in the chromaticity diagram also located within the required range, and they are not described here for concise purpose. Besides, when the design requirement is much closer to the sRGB standard, a better case is that the ratio of the red energy to the blue energy is between 0.5 and 0.7. If the application of high color gamut is considered, the x coordinate of the red point can be specified as between 0.66 and 0.68.

In the embodiment (not shown) of an OLED display panel emitting blue, green and red lights, the materials or weight percentages of the light-emitting layers of the respective colors, or the current inputted to the light-emitting layers can be designed, so that the peak wavelength of the blue portion of the intensity spectrum of the light-emitting layer is between 440 nm and 470 nm, the peak wavelength of the green portion is between 500 nm and 550 nm, the wavelength of the red portion is between 600 nm and 660 nm, and the ratio of the green energy to the blue energy or the ratio of the red energy to the blue energy is adjusted. Therefore, the coordinates of the color points in the chromaticity diagram can be located within the required range, and the related descriptions are omitted here for concise purpose.

Figure 4:
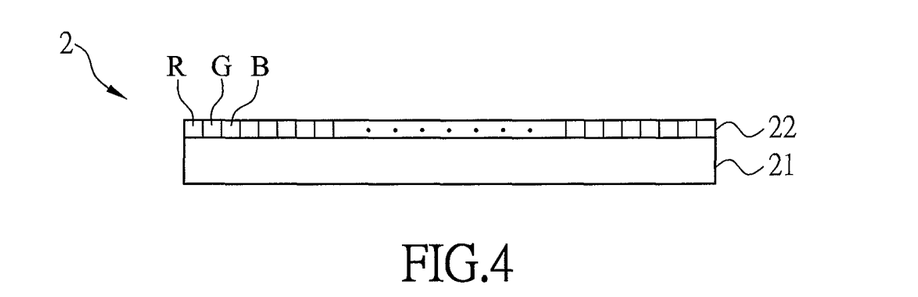
FIG. 4 is a schematic diagram of a display panel being a quantum dot display panel according to an embodiment of this disclosure.

FIG. 4 is a schematic diagram of a display panel 2 being a quantum dot display panel according to an embodiment of this disclosure. The display panel 2 includes a substrate 21 and a quantum dot light-emitting layer 22. The quantum dot light-emitting layer 22 includes a plurality red portions R, a plurality of green portions G and a plurality of blue portions B, which are disposed by turns. The display panel further includes an opposite substrate (not shown). The substrate 21 and the opposite substrate each can be a glass substrate, a transparent acrylic substrate or a flexible substrate, and also can be a touch substrate. The substrate 21 and the opposite substrate can be covered by a protection film. In this case, the light emitted by the red portions R brings about the red energy of the light out of the display panel 2 and the red energy can be shown by the red spectrum of the light, the light emitted by the green portions G brings about the green energy of the light out of the display panel 2 and the green energy can be shown by the green spectrum of the light, and the light emitted by the blue portions B brings about the blue energy of the light out of the display panel 2 and the blue energy can be shown by the blue spectrum of the light. Herein, the red spectrum is obtained when the display panel only displays the image of the highest gray level of red (e.g. 255th gray level), the green spectrum is obtained when the display panel only displays the image of the highest gray level of green (e.g. 255th gray level), and the blue spectrum is obtained when the display panel only displays the image of the highest gray level of blue (e.g. 255th gray level).

In this embodiment, the materials or weight percentages of the quantum dot light-emitting layer of the respective colors, or the current inputted to the quantum dot light-emitting layer can be designed, so that the peak wavelength of the blue portion of the intensity spectrum of the quantum dot light-emitting layer is between 440 nm and 470 nm, the peak wavelength of the green portion is between 500 nm and 550 nm, the wavelength of the red portion is between 600 nm and 660 nm, and the ratio of the green energy to the blue energy or the ratio of the red energy to the blue energy is adjusted. Therefore, the coordinates of the color points in the chromaticity diagram can be located within the required range, and the related descriptions are omitted here for concise purpose.

Figure 6:
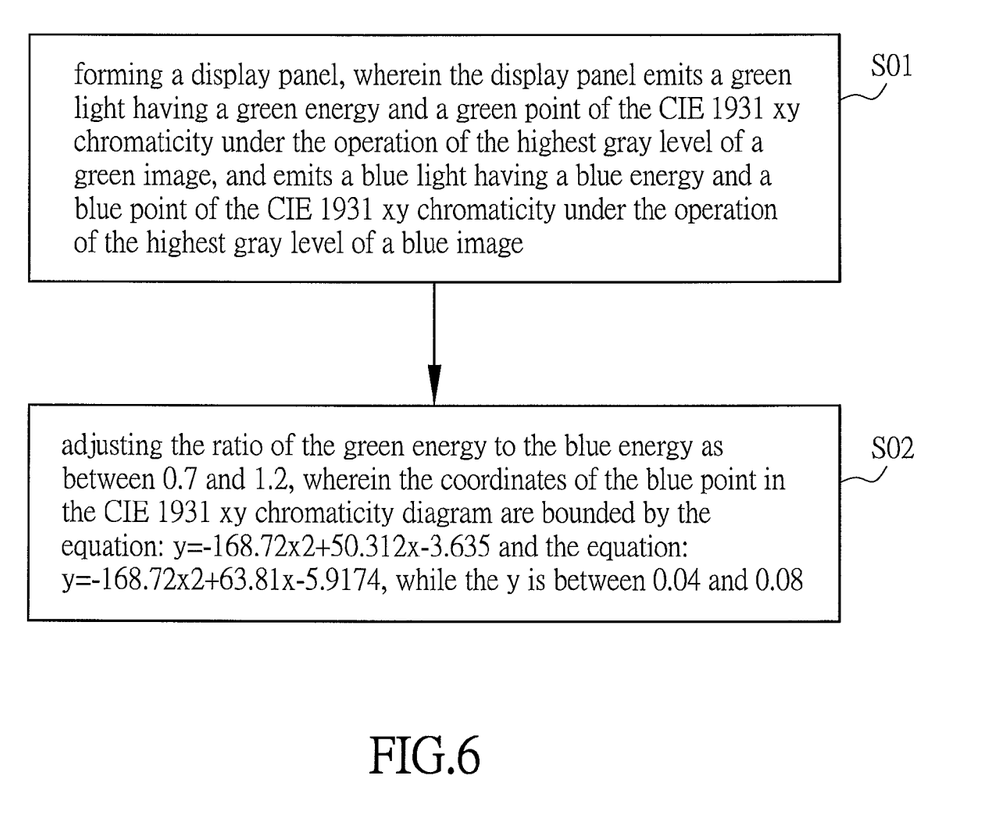
FIG. 6 is a flow chart of a manufacturing method of a display apparatus according to an embodiment of this disclosure.

FIG. 6 is a flow chart of a manufacturing method of a display apparatus according to an embodiment of this disclosure. The manufacturing method includes the steps of forming a display panel, wherein the display panel emits a green light having a green energy and a green point of the CIE 1931 xy chromaticity under the operation of the highest gray level of a green image, and emits a blue light having a blue energy and a blue point of the CIE 1931 xy chromaticity under the operation of the highest gray level of a blue image (S01); and adjusting ratio of the green energy to the blue energy as between 0.7 and 1.2, wherein the coordinates of the blue point (x, y) in the CIE 1931 xy chromaticity diagram are bounded by the equation: $y=-168.72x^2+50.312x-3.635$ and the equation: $y=-168.72x^2+63.81x-5.9174$, while the y is between 0.04 and 0.08 (S02). The display panel can be an LCD panel, a quantum dot display panel or an OLED display panel. Under the operations of the highest gray level of a green and a blue image respectively, the ratio of the green energy to the blue energy can be further between 0.8 and 1.1. Under the operations of the highest gray level of a red and a blue image respectively, the ratio of the red energy to the blue energy can be between 0.49 and 0.75. Under the operations of the highest gray level of a red and a blue image respectively, the ratio of the red energy to the blue energy can be further between 0.5 and 0.7. The technical features of the manufacturing method of the display panel of this embodiment are also clearly illustrated in the foregoing embodiments, and therefore they are not described here for concise purpose.

In summary, in the display apparatus and the manufacturing method thereof, under the operations of the highest gray level of a green and a blue image respectively, the ratio of the green energy to the blue energy, or the ratio of the red energy to the blue energy is designed in conformity with the above-mentioned condition so that the color points in the chromaticity diagram can be located closer to the locations defined by the sRGB standard. Therefore, the display quality of the display apparatus of this disclosure is enhanced a lot.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display apparatus, comprising:
   a display panel, emitting a green light having a green energy and a green point of the CIE 1931 xy chromaticity under the operation of the highest gray level of a green image, and emitting a blue light having a blue energy and a blue point of the CIE 1931 xy chromaticity under the operation of the highest gray level of a blue image,
   wherein the ratio of the green energy to the blue energy is between 0.7 and 1.2 and the coordinates of the blue point in the CIE 1931 xy chromaticity diagram are bounded by the equation: $y=-168.72x^2+50.312x-3.635$ and the equation: $y=-168.72x^2+63\ 0.81x-5.9174$, while the y is between 0.04 and 0.08,
   wherein the coordinates of the green point in the chromaticity diagram are bounded by the equation: $y=-48.85x^2+22.964x-2.0014$ and the equation: $y=-48.85x^2+26.872x-2.9981$, while the y is between 0.64 and 0.7.

2. The display apparatus as recited in claim 1, wherein the ratio of the green energy to the blue energy is further between 0.8 and 1.1.

3. The display apparatus as recited in claim 1, wherein the display panel emits a red light having a red energy and a red point of the CIE 1931 xy chromaticity under the operation of the highest gray level of a red image, and the ratio of the red energy to the blue energy is between 0.49 and 0.75.

4. The display apparatus as recited in claim 3, wherein the ratio of the red energy to the blue energy is further between 0.5 and 0.7.

5. The display apparatus as recited in claim 3, wherein the coordinates of the red point in the chromaticity diagram are bounded by the equation: $y=-2.021x^2+2.1871x-0.2218$ and the equation: $y=-2.021x^2+2.1871x-0.2618$, while the x is between 0.62 and 0.66.

6. The display apparatus as recited in claim 3, wherein the coordinates of the red point in the chromaticity diagram are bounded by the equation: $y=-2.021x^2+2.1871x-0.2218$ and the equation: $y=-2.021x^2+2.1871x-0.2618$, while the x is between 0.66 and 0.68.

7. The display apparatus as recited in claim 3, wherein the red energy is corresponding to an integral area of a red spectrum of the light.

8. The display apparatus as recited in claim 1, wherein the display panel is a liquid crystal display panel.

9. The display apparatus as recited in claim 1, wherein the display panel is a quantum dot display panel.

10. The display apparatus as recited in claim 1, wherein the display panel is an organic light-emitting diode (OLED) display panel.

11. The display apparatus as recited in claim 10, wherein the OLED display panel includes a substrate and a light-emitting layer, which is disposed on the substrate and includes a plurality of red light-emitting portions, a plurality of green light-emitting portions and a plurality of blue light-emitting portions.

12. The display apparatus as recited in claim 10, wherein the OLED display panel includes a substrate, a light-emitting layer and a filter layer, the light-emitting layer is disposed on the substrate and emits white light, and the filter layer is disposed on the light-emitting layer and includes a plurality of red filter portions, a plurality of green filter portions and a plurality of blue filter portions.

13. The display apparatus as recited in claim 1, wherein the green energy is corresponding to an integral area of a green spectrum of the light, and the blue energy is corresponding to an integral area of a blue spectrum of the light.

14. A manufacturing method of a display apparatus, comprising:
   forming a display panel, wherein the display panel emits a green light having a green energy and a green point of the CIE 1931 xy chromaticity under the operation of the highest gray level of a green image, and emits a blue light having a blue energy and a blue point of the CIE 1931 xy chromaticity under the operation of the highest gray level of a blue image; and
   adjusting the ratio of the green energy to the blue energy as between 0.7 and 1.2, wherein the coordinates of the blue point in the CIE 1931 xy chromaticity diagram are bounded by the equation: $y=-168.72x^2+50.312x-3.635$ and the equation: $y=-168.72x^2+63.81x-5.9174$, while the y is between 0.04 and 0.08, wherein the coordinates of the green point in the chromaticity diagram are bounded by the equation: $y=-48.85x^2+22.964x-2.0014$ and the equation: $y=-48.85x^2+26.872x-2.9981$, while the y is between 0.64 and 0.7.

15. The manufacturing method as recited in claim 14, wherein the ratio of the green energy to the blue energy is further between 0.8 and 1.1.

16. The manufacturing method as recited in claim 14, wherein the display panel emits a red light having a red energy and a red point of the CIE 1931 xy chromaticity under the operation of the highest gray level of a red image, and the ratio of the red energy of the light to the blue energy is between 0.49 and 0.75.

17. The manufacturing method as recited in claim 16, wherein the ratio of the red energy to the blue energy is further between 0.5 and 0.7.

18. The manufacturing method as recited in claim 14, wherein the display panel is a liquid crystal display panel, a quantum dot display panel or an organic light-emitting diode display panel.

* * * * *